United States Patent
Przybylek

(10) Patent No.: US 7,406,558 B2
(45) Date of Patent: Jul. 29, 2008

(54) SOFTWARE METHOD OF EMULATION OF EEPROM MEMORY

(75) Inventor: Piotr Przybylek, Zielona Gora (PL)

(73) Assignees: Advanced Digital Broadcast Polska SP.Z O.O., Zielona Góra (PL); Advanced Digital Broadcast Ltd., Taipei (TW)

( * ) Notice: Subject to any disclaimer, the term of this patent is extended or adjusted under 35 U.S.C. 154(b) by 221 days.

(21) Appl. No.: 10/595,826

(22) PCT Filed: Dec. 6, 2004

(86) PCT No.: PCT/PL2004/000102

§ 371 (c)(1), (2), (4) Date: May 15, 2006

(87) PCT Pub. No.: WO2005/055244

PCT Pub. Date: Jun. 16, 2005

(65) Prior Publication Data

US 2007/0143528 A1    Jun. 21, 2007

(30) Foreign Application Priority Data

Dec. 8, 2003    (PL) .................................. 363945

(51) Int. Cl.
G06F 12/12    (2006.01)
(52) U.S. Cl. ........................................ 711/103
(58) Field of Classification Search ............ 711/103; 703/24
See application file for complete search history.

(56) References Cited

U.S. PATENT DOCUMENTS 5,651,128 A    7/1997    Gaultier (Continued)

FOREIGN PATENT DOCUMENTS

EP    0991081    4/2000

OTHER PUBLICATIONS

Bahout Y: "Combined Flash and EEPROM integrated circuit", Electronik Industrie, XX, XX, vol. 28, No. 10, 1997, pp. 48, 50-51.

Primary Examiner—Kevin L Ellis
(74) Attorney, Agent, or Firm—Matthias Scholl P.C.; Matthias Scholl

(57) ABSTRACT

The object of the invention is a software method of emulation of the EEPROM memory in another non-volatile memory, for example the Flash type memory. This method is applicable in systems, where in order to decrease costs of devices, using a non-volatile EEPROM memory, the existing memory is used, for example the Flash type memory for emulation of the EEPROM memory. The method according to the invention characterized in that after initiating the emulation, two sectors of the non-volatile memory are reserved, serving the function of the current sector and the auxiliary sector and two buffers are created in the operational memory, the first of which stores always the most current image of the emulated EEPROM memory, and the second stores the last patch, moreover the current sector of non-volatile memory is organized in such a way that a part of the sector contains the original image of the emulated memory, and remaining part is successively filled in with the patches, describing changes in the content of the original image of the emulated memory, in turn, at the time, when a new patch cannot be appended to the current sector, the functions of the sectors of non-volatile memory are changed, thanks to which the previously auxiliary sector of non-volatile memory is activated by saving the current image of the emulated memory from RAM memory to newly activated sector as a new original image of the emulated memory, however, after a correct writing, the content of the previously current sector of non-volatile memory is erased.

20 Claims, 8 Drawing Sheets

U.S. PATENT DOCUMENTS

| | | | |
|---|---|---|---|
| 6,904,400 B1 * | 6/2005 | Peri et al. ..................... | 703/28 |
| 7,058,755 B2 * | 6/2006 | Nallapa ....................... | 711/103 |
| 2003/0046631 A1 * | 3/2003 | Gappisch et al. ............ | 714/763 |
| 2003/0189858 A1 * | 10/2003 | Sowards et al. ............. | 365/200 |
| 2005/0055496 A1 * | 3/2005 | Nallapa ....................... | 711/103 |
| 2006/0282610 A1 * | 12/2006 | Dariel et al. ................. | 711/103 |

* cited by examiner

SOFTWARE METHOD OF EMULATION OF EEPROM MEMORY

CROSS-REFERENCE TO RELATED APPLICATIONS

This is a National Stage Application of International Patent Application No. PCT/PL2004/000102, with an international filing date of Dec. 6, 2004, which is based on Polish Patent Application No. P-363945, filed Dec. 8, 2003.

BACKGROUND OF THE INVENTION

1. Field of the Invention

The object of the invention is a software method of emulation of the EEPROM memory in another non-volatile memory, for example the Flash type memory. This method is applicable in systems, where in order to decrease costs of devices, using a non-volatile EEPROM memory, the existing memory is used, for example the Flash type memory for emulation of the EEPROM memory.

2. Brief Description of the Background of the Invention Including Prior Art

There is a hardware method of memory emulation in the integrated circuit itself, known from the European patent application number EP0991081. Its disadvantages are: firstly, limiting the emulation memory to one circuit and type of memory, secondly, a low ratio of a size of emulated EEPROM memory to a size of Flash memory used for the same purpose (1:8) and thirdly, a small size of the emulated memory, up to 8 KB.

Another method is known from publication written by Yvon Bahout, "Combined Flash and EEPROM Integrated Circuit," *Elektronik Industrie*, vol. 28, No. 10, pp. 48, 50-51, October 1997. The method presents a cost-effective hardware only solution of a combined Flash and EEPROM chip. Each memory type block operates independently of the other during data writing. This results in that concurrent operation mode is possible and thus the Flash memory can be read while the EEPROM memory is being written.

Another hardware solution is the circuit, described in American patent document no. U.S. Pat. No. 5,651,128 presenting a memory, which consists of a matrix of cells and circuits, which enable programming of deletion of the emulated memory, the Flash type memory is used in the example of embodiment of the emulation.

In case of the described solutions, the emulation of the EEPROM memory is made with the use of a hardware solution, where the circuit uses the Flash type memory to store data both assigned for saving in the Flash memory as well as in the EEPROM memory.

SUMMARY OF THE INVENTION

1. Purposes of the Invention

It is an object of this invention to provide a method of emulation of EEPROM memory that is enable to work with every currently applied Flash memory circuit.

This and other objects and advantages of the present invention will become evident from the description which follows.

2. Brief Description of the Invention

The difference between the presented methods and the solution according to the invention consists in that the emulation according to the invention, in contrary to the known solutions is conducted in a software way. Thanks to it, this method can be applied in any device and in any type of the Flash memory. The essence of the invention is the logical software layer, which controls monitoring and use of the emulated memory. Moreover, by selecting this type of emulation both the costs of purchase of memory circuits and the use of the surface of printed circuit boards are lower, eliminating, much more expensive than the Flash memory (in calculation per 1 KB of memory), the EEPROM memory circuit, which is generally assembled as a separate module. Additionally the benefit is based on the decreased, simplified and miniaturized electronic circuit, which hitherto was using the EEPROM memory.

Each device, which requires a non-volatile memory of the first type, for example the Flash type memory and the EEPROM type memory, can be designed in such a way that the method of emulation of the EEPROM memory in the storage of the first type, according to the invention, is used and thus both the costs of circuits and the quantity of the required space for digital circuits assembled on the printed circuit boards are decreased. This allows designing universal devices, the key element of which is independence from configuration of the memory block, where a combination of the Flash and the EEPROM memory or a combination of the Flash and emulated EEPROM memory can be applied. The elimination of the EEPROM memory is usually possible without a need to increase the size of the FLASH memory. The increase of the Flash memory is more favorable than the cost of an additional the EEPROM circuit, in view of the price of the EEPROM memory, which has 32 times higher price per 1 KB in relation to the FLASH memory. The additional Flash memory can serve not only for the emulation of the EEPROM memory.

One of the problems, which are encountered with emulation of the EEPROM memory in the Flash type memory, is the fact that the Flash memory operates in a different way. Data should be changed by whole sectors. They cannot be changed by bytes, like in case of the EEPROM memory, which forces the use of a driver, which, by making operation available according to typical EEPROM memories, will operate on sectors of the Flash memory. In order to decrease the number of required write operations to the Flash memory another solution was applied. Because during a typical work of the EEPROM memory, data are updated frequently and in small quantities, for example with a single byte, during emulation of the EEPROM memory data are collected and saved after a certain time as a patch. Such time can be, for example, defined in seconds or as a number of changes made on the data stored in the operational memory. Additionally, the saved data can be compressed if that is favorable. One of the requirements for operation of the emulation of non-volatile EEPROM memory is to guarantee possession of a correct copy of data even if these are not the most up-to-date data.

Such situation takes place for example in case of a voltage failure during the operation of data writing. In order to ensure the required security of data of the emulated EEPROM memory, servicing of a data copy was applied. That is why the system requires a double size of space in the Flash memory in order to emulate a given size of the EEPROM memory. After programming data in one of the two sectors of the Flash memory, the second sector must be erased. In case of emulation of the EEPROM memory with a size of 32 KB, two sectors of the Flash memory are used, with the size of 64 Kb each. Additionally, there are three types of buffers in the operational RAM memory. The first of them stores always the most up-to-date image of the emulated EEPROM memory. The second one stores the last patch, and the last one is optionally used for storing the patch after compression.

The novel features which are considered as characteristic for the invention are set forth in the appended claims. The invention itself, however, both as to its construction and its method of operation, together with additional objects and advantages thereof, will be best understood from the following description of specific embodiments when read in connection with the accompanying drawings.

BRIEF DESCRIPTION OF THE DRAWINGS

In the accompanying drawings one of the possible embodiments of the present invention is shown, where.

DESCRIPTION OF INVENTION AND PREFERRED EMBODIMENT

Figure 1:
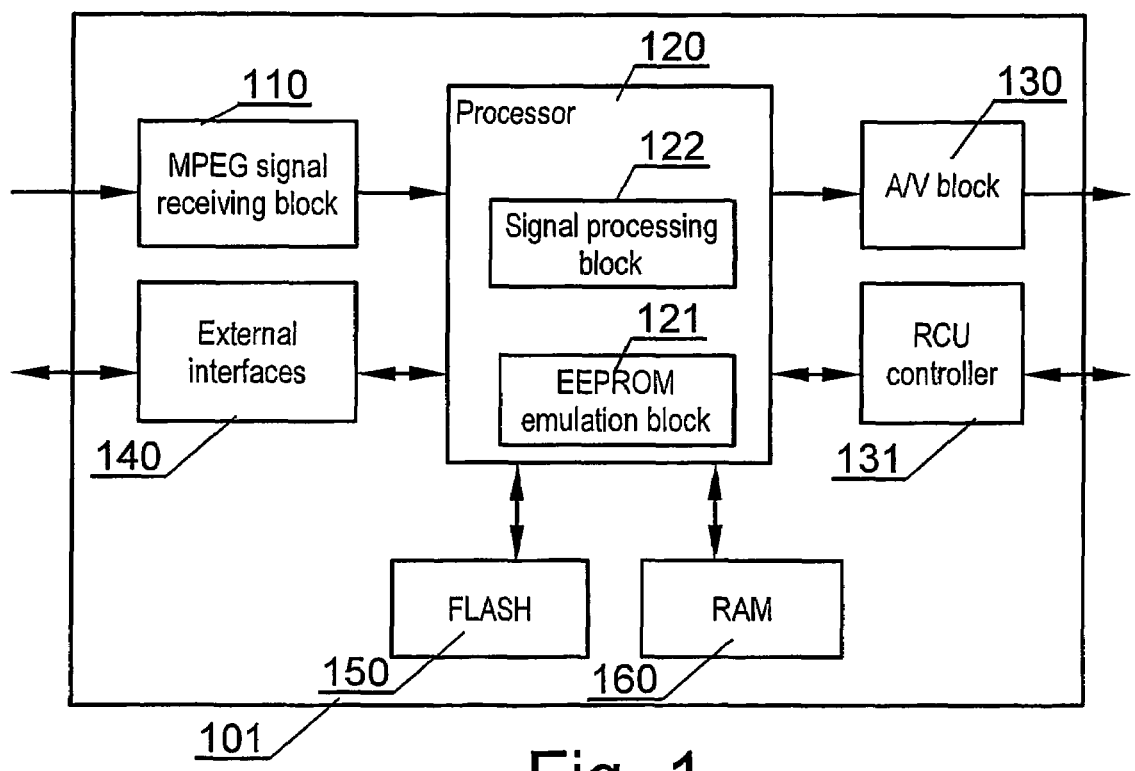
FIG. 1 shows a digital television decoder with an EEPROM memory emulation block.

The signal receiver, presented in FIG. 1 of the drawing, which is a decoder of digital television, is presented for the needs of the invention in a simplified version, with only these elements disclosed, which are required for presenting the idea of the invention. The decoder of digital television 101 includes many modules. The most important of them is the processor 120 which manages operation of the device. Additionally, according to the invention, the processor services an internal block 121, which controls emulation of the EEPROM memory and a signal-processing block 122. There is a signal from the signal receiving block 110 connected to the processor. Additionally, the processor has a possibility of bidirectional exchange of data through external interfaces 140. The digital television decoder includes also a few types of memory, which are bidirectionally connected with the processor. These are for example, a non-volatile memory, favorably of the Flash type 150, and operational RAM memory 160. There are programs stored in these memories, which control the operation of the digital television decoder. Blocks 130 and 131 make it possible to transmit the output ANV signal respectively and communicate with external control devices, for example a remote control unit (RCU).

Figure 2:
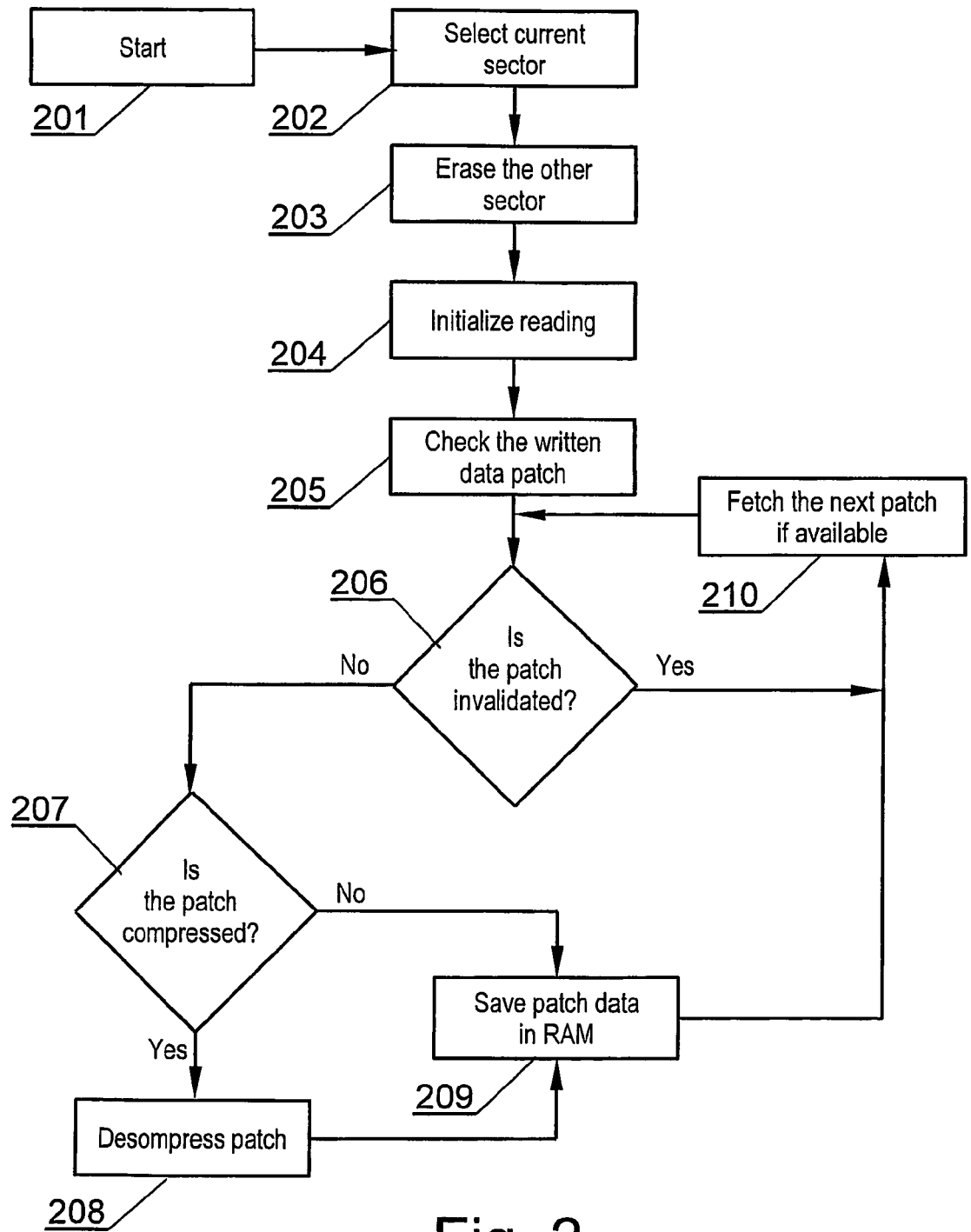
FIG. 2 shows a flow chart of a procedure of starting of memory emulation.
Figure 3:
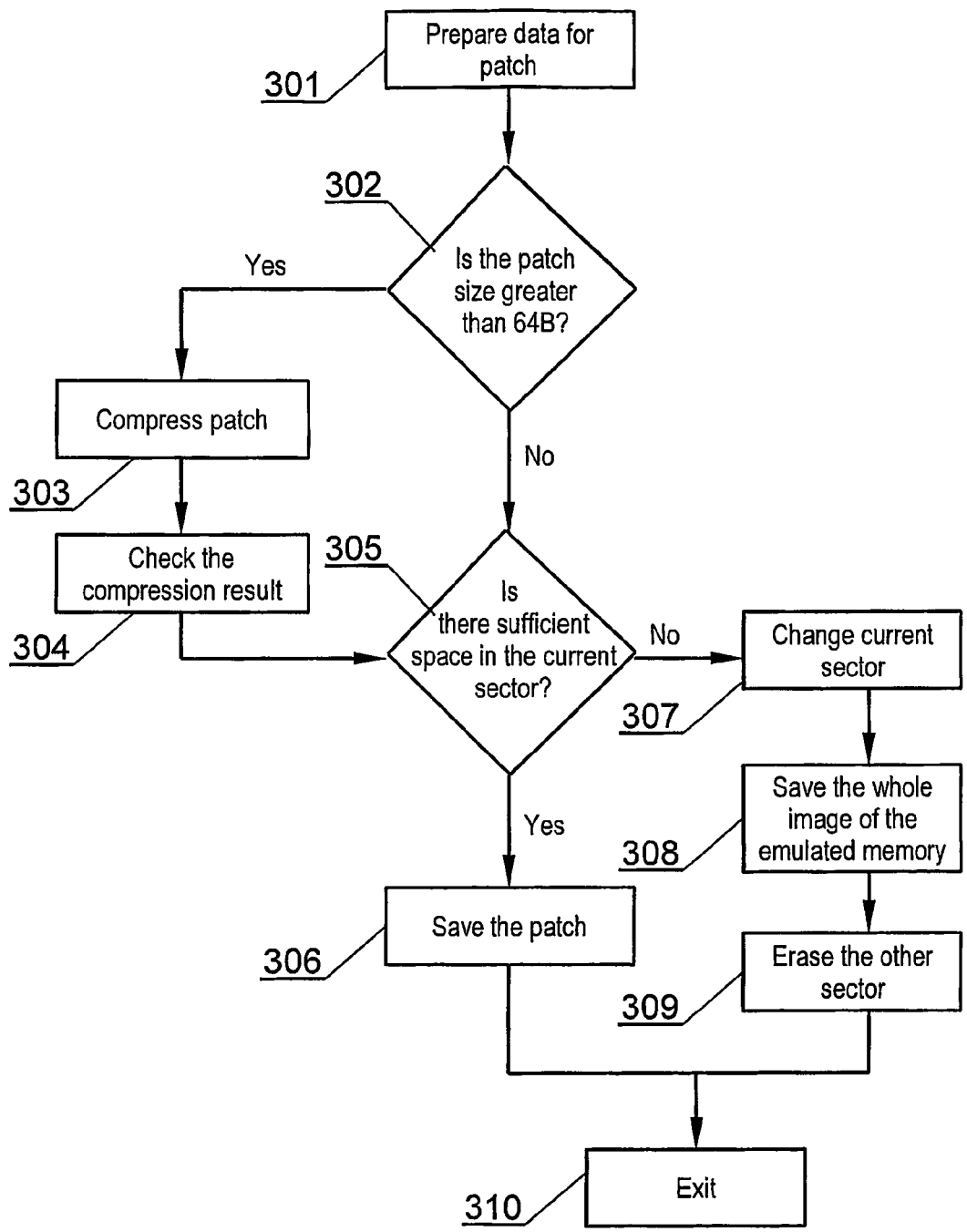
FIG. 3 shows a procedure of saving data to the memory.

FIG. 2 presents a process of initiating emulation of the EEPROM memory emulation according to the invention. This procedure is performed at starting the device, which uses emulation. The procedure starts in the point 201. Next in step 202, a sector is selected, from which data will be read, as the current sector. One of two sectors is selected on the basis of a few criteria. They will be presented in details in FIG. 9. Next, in step 203 of the procedure, the content of the second sector is erased. Point 203 of the procedure is executed, if the auxiliary memory sector contains data, despite that it should not. Such situation can take place at the first start of the emulation of the EEPROM memory, it there were other data earlier in this memory sector or in case, when saving of the first patch of data update to the second was interrupted, for example as a result of a failure of power supply, or just after finishing it, but before deletion of the content of the first sector. In such case, at the next start of emulation, there are data in two sectors and that is why one of them is erased. Next reading of selected sector 204 of the Flash memory is initiated, fetching the original image of the emulated EEPROM memory into the operational RAM memory. It can be for example 32 KB of one sector of the Flash memory, the size of which is usually 64 KB. If there is an error during reading, for example data are not correct; the content of the current sector is erased. In the point 205 of the procedure the first patch of data update is collected from the Flash memory and its validity is checked, i.e. it is checked if it contains valid data 206. If the patch was not invalidated (the point 805), in the point 207 of the procedure, it is checked if the patch data are compressed. If they are compressed, in the point 208 it is decompressed. In opposite case the procedure goes directly to the point 209, where data of the patch are saved in the operational memory RAM, storing the current image of the emulated EEPROM memory. The last point of the procedure is to check 210 if there are still data to be read in the Flash memory. If it is so, the procedure processes the next patches according to the described algorithm. If the last patch is saved, the procedure finishes its operation. After completing the procedure from FIG. 2, there are all data, of the emulated EEPROM memory, available in the operational memory. FIG. 3 illustrates the procedure of saving data of the EEPROM memory, being emulated, in the Flash memory. It starts in the point 301, where data are prepared for updating the content of the Flash memory. These data are also saved in the buffer of the RAM operational memory, which always stores the current contents of the emulated EEPROM memory, which will be presented in detail in FIG. 8 of the drawing.

Next, in step 302 of the procedure, a check is made if the size of the patch is bigger than the defined value. These are 64 bytes in the presented example of embodiment. If it is so, the procedure moves to the point 303, where the patch is being compressed. In the example of embodiment it is assumed that the patch, the size of which is lower than 64 bytes, is not being compressed due to a low probability of a reduction of the patch size. Next, in the point 304 of the procedure the result of compression from the point 303 is checked. This check defines if the gain from data compression is large enough, to bear the additional cost of time needed for decompression of patch at the moment of initiating the system of emulation of the EEPROM memory according to the invention. If it is so, the compressed patch is processed further, and if not, the uncompressed patch is being processed. Next the saving procedure moves to the point 305, where it is checked if there is appropriate space to write a new patch of updating data in the current sector of flash memory. If it is so, the patch, i.e. the recently modified data, is saved in the point 306 in the Flash memory—which is in detail illustrated in FIG. 7 in connection with FIG. 6. In opposite case, the current sector is changed into the second one in the point 307 of the procedure. Next the full image of operational RAM memory stored in the buffer, i.e. the current image of the emulated EEPROM memory is saved as a new original image of the emulated EEPROM memory in the point 308 of the procedure. Next in the point 309 the content of the second sector of the Flash memory is erased, because only then it is certain that the data of the emulated EEPROM memory will not be lost. In this place in the newly selected sector of the Flash memory there is already additional place for new patches.

The procedure of saving finishes its operation in the point 310. An exemplary format of the patch, in accordance with which data are saved in the Flash memory, is presented in FIG. 4. It consists of four fields, out of which the first one is a header of the patch 401, the second is the size of the data group 402 (the field, which appears in case of patches, with many groups of data update (so called Multi Block Patch), the third one is an offset of data in relation to the initial address 403. This field appears only in case of uncompressed patches. The last field are the data 404. The patch can include many groups of data (multi block patch), of which every one is saved under a different memory address. In case when the patch is compressed, it does not contain an offset field, while the value of the offset itself is read only after decompression of the patch. In case when the patch contains many data groups (multi block patch), the values of fields 403 contain an offset in relation to the final address of the previous data group. In this way only the first offset defines the absolute address, and next values are relative addresses in relation to the previous data group. This allows for decreasing the number of bits, where memory addresses are saved.

Figure 5:
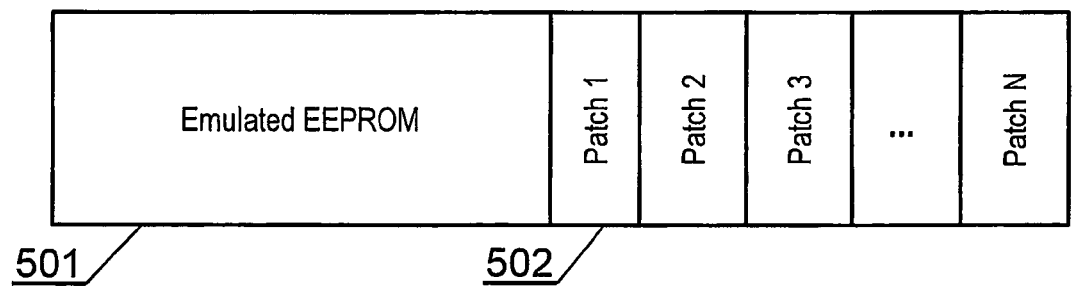
FIG. 5 shows a sector of a Flash memory containing data of an emulated EEPROM memory and patches.

Division of the Flash memory sector into two parts was illustrated in FIG. 5. The first of them 501 is the original image of the emulated EEPROM memory, and the second 502 is a set of patches of this memory. A sector in the Flash memory has a size of 64 KB, and therefore it always contains a full original image of the emulated EEPROM memory, even uncompressed, as well as up to a few thousands of patches. The full image is saved at the beginning of each sector as the original image of the emulated memory. A full image can be saved every time and the sector can be changed with every record, but the solution with the application of patches is more effective, because these patches are generally much smaller than 32 KB.

The preferred embodiments having been thus described, it will now be evident to those skilled in the art that further variation thereto may be contemplated. Such variations are not to be regarded as a departure from the invention, the true scope of the invention being set forth in the claims appended hereto.

Figure 4:
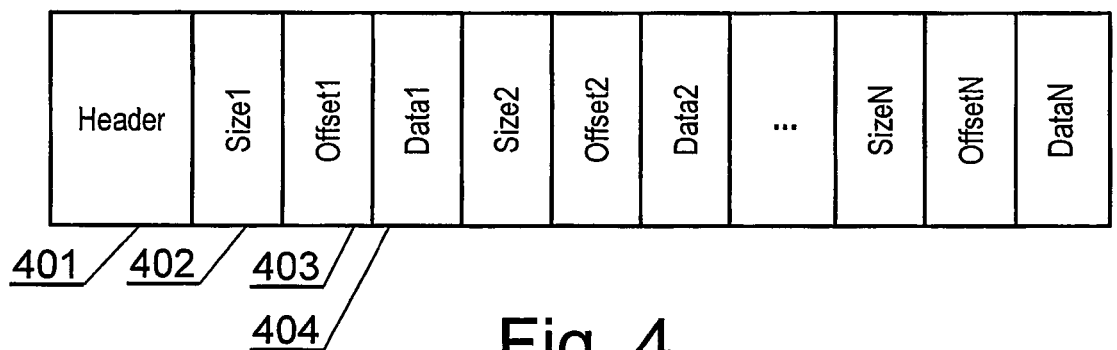
FIG. 4 shows an exemplary format of a patch.
Figure 6:
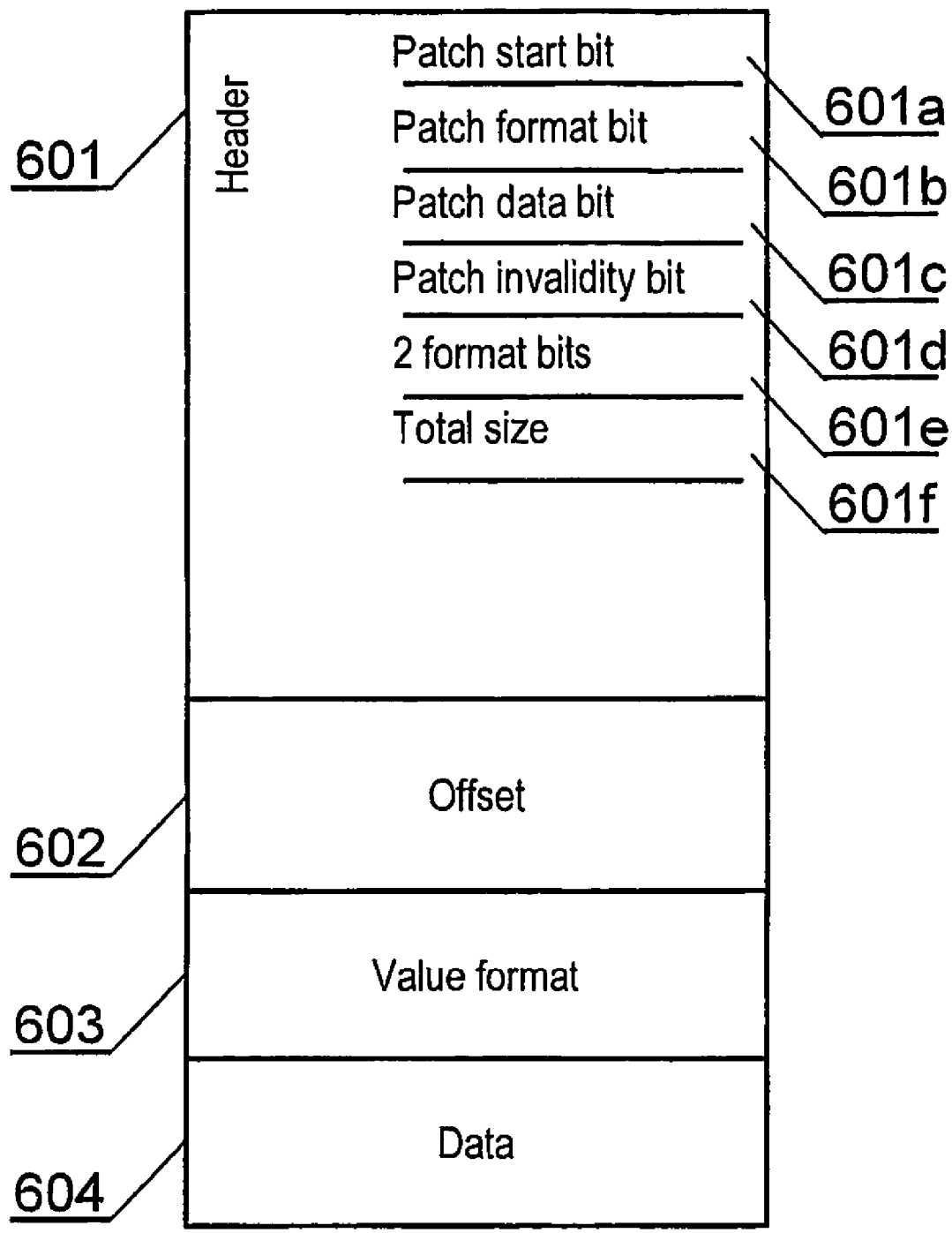
FIG. 6 shows a format of a patch header.

The format of the header of the patch from FIG. 4 was presented in FIG. 6. The elements 601-604 correspond to 401-404. The header 601 consists of 7 parts 601a-601g. The bit 601a is the start bit, changed at the time of starting preparation for saving the patch. 601b is the bit of "correct writing of the size and format" changed after the size and format of data are correctly saved. 601c is a bit of "correct writing", changed after the whole patch is correctly saved in the Flash memory. By means of these three bits during data reading 206 one can ascertain how many consecutive bytes could have been changed in the Flash memory and based on this define where the next patch can be located. If, at any time, there is a failure of power supply, the next patches can be saved without a necessity of deleting the whole sector, right after the patch, saving of which was not finished. 601d is the bit, which is changed after the patch is invalidated. If thus, the next patch would restore the state of the EEPROM memory from before the last update, instead of saving the next patch, the previous one can be invalidated. 601e are two bits, the value of which defines the format of the patch. By means of two bits one can define four formats, however 3 formats can be defined in the exemplary solution, and the fourth possible value can be reserved for a future upgrade of the system, according to the idea of the invention. The exemplary formats are:

0x00 a single uncompressed block
0x01 a single compressed block
0x10 many groups of uncompressed data The last field of the header of the patch is 601f, in which the total quantity of data is defined in the patch, regardless of the size of the header. In case of fields 601f, 602 and 603 the first two bits define the format, in which the values of data quantity and address offsets are saved. The values of the bits for the field 602b can determine for example if:

0x00 the field is described with the use of 4 bits.
0x01 the field is described with the use of 8 bits.
0x10 the field is described with the use of 12 bits.

The values of these bits for fields 601f and 603b can determine for example if:

0x00 the field is described with the use of bits from the current byte.
0x01 the field is described with the use of bits from the current and next byte.
0x10 the field is described with the use of bits from the current byte and the next two bytes.

Figure 7:
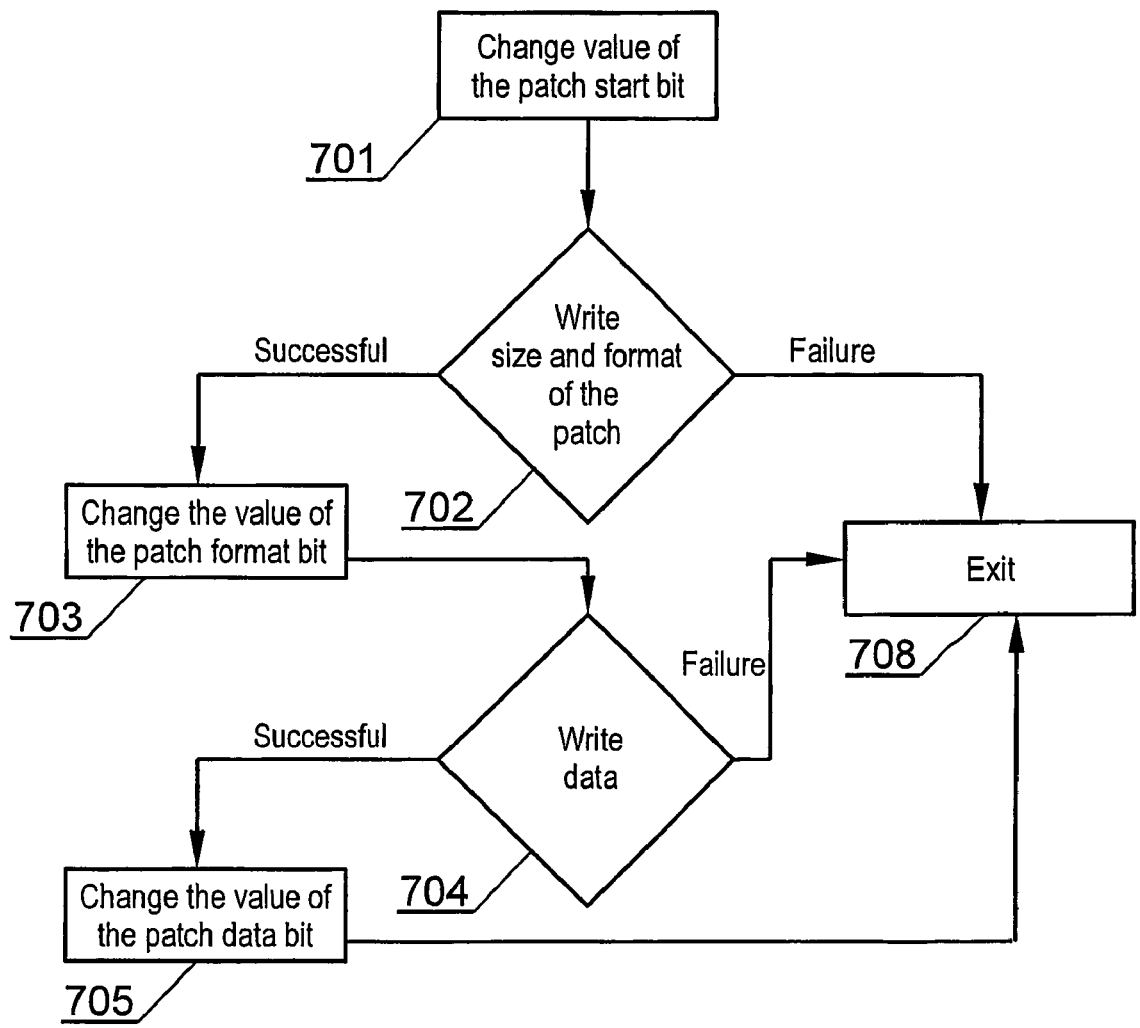
FIG. 7 shows a flow chart of a procedure of saving update data.
Figure 8:
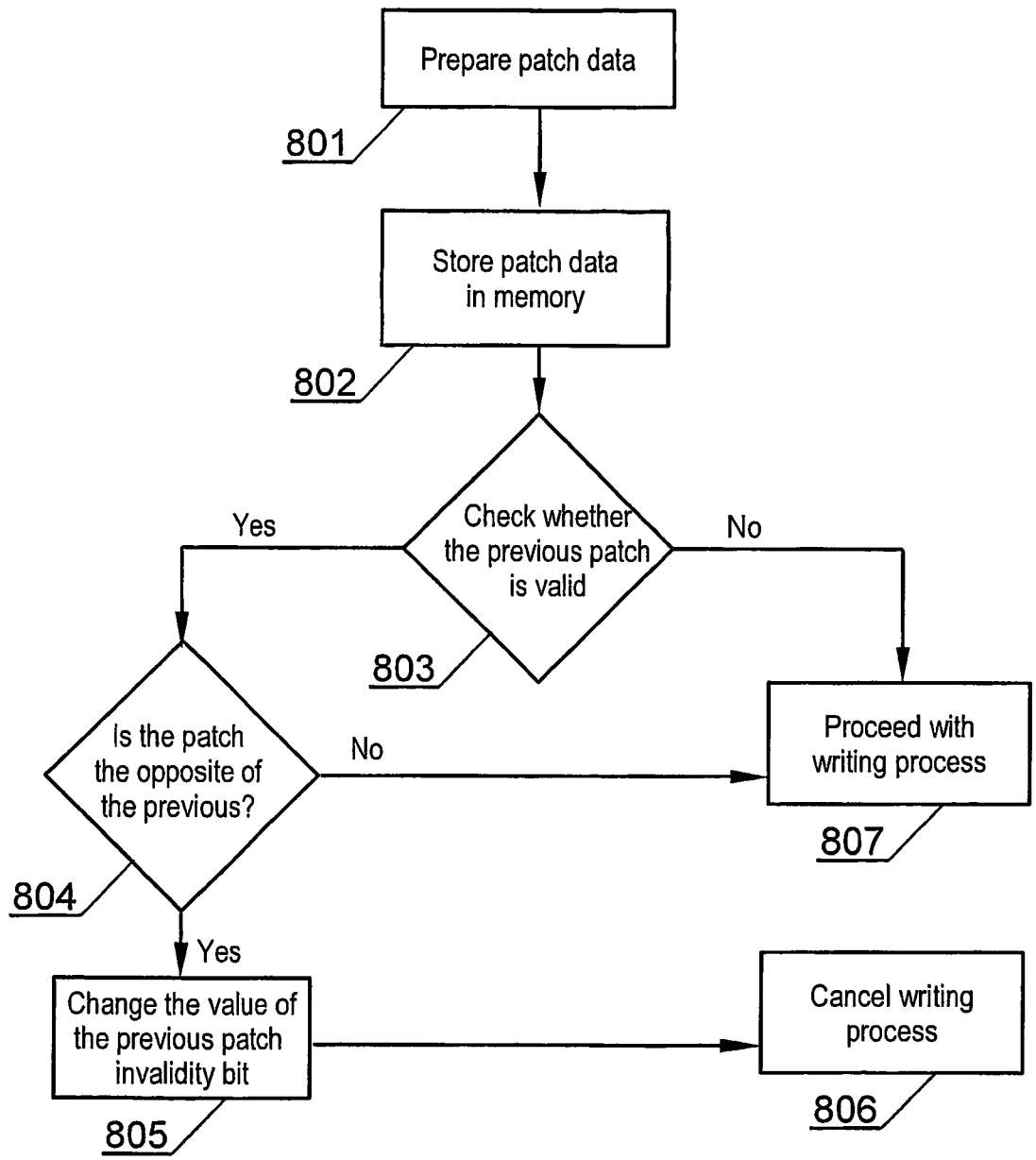
FIG. 8 shows a flow chart of a procedure of preparing data for updating of the patch.

FIG. 7 presents in detail the point 306 of the procedure from FIG. 3 of the drawing. Writing of the patch starts in the point 701, where the value of the start bit 601a is changed. Next in the point 702 of the procedure the size and type of the patch are saved—fields 601e, 601f. If an error occurs, the procedure ends. In majority of cases an error is a power supply failure. If saving of the values of fields is correct, the procedure moves to the point 703. In this step the value of the bit in the field 601b is changed. Next, in the point 704 of the procedure, separate data groups are saved. If an error occurs, the procedure ends. If saving is correct, the procedure moves to the point 705. In this step, the value of the bit in the field 601c is changed. At this moment the procedure ends, and the patch is correctly saved in the Flash memory. After saving there is an additional possibility of invalidating the patch. If the patch is to be invalidated, in the procedure illustrated in FIG. 8 the value of the field 601d is changed. The procedure of preparing data for updating with a possibility of invalidating the previously saved patch is shown in FIG. 8. The diagram is a particularization of the point 301 from FIG. 3 of the drawing. The procedure starts in the point 801, where the patch is prepared for saving in the memory. The patch header is being created among others. Next in the point 802 data are saved in RAM memory, which stores the most current image of the EEPROM memory, at the same time the prepared patch is stored in the buffer of the RAM memory. In turn, in step 803 of the procedure a check is made, if the patch recently saved in the Flash memory is valid—the value of the field 601d. If the patch is invalidated, the writing process 807 of a new patch is continued. In opposite case, when the hitherto saved patch is valid, the procedure advances to point 804, where it is checked if the currently processed patch reverses changes introduced with the saving of the previous patch. If not, the writing process of the patch is continued 807. In the opposite case, when the patch reverses changes introduced by saving of the previous patch, the procedure advances to the point 805. In this place the value of bit 601d, which invalidates the previously saved patch, is changed. Further the procedure moves to the point 806, where it cancels (stops) saving of the new patch to the Flash memory.

Figure 9:
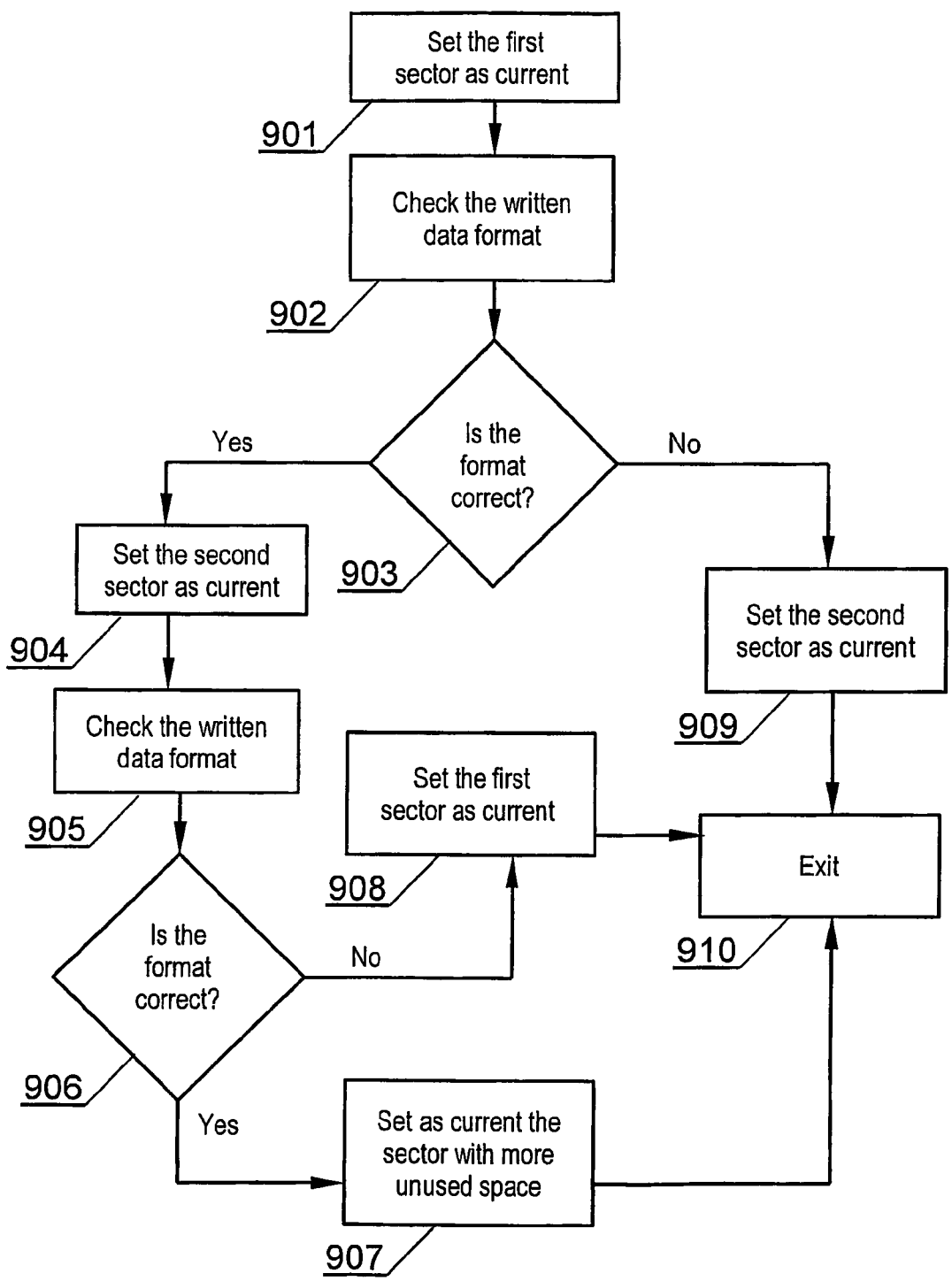
FIG. 9 shows a flow chart of a procedure of selecting a current non-volatile memory sector.

The procedure of selecting the current sector is presented in detail in FIG. 9. This procedure is initiated in the point 202 from FIG. 2 of the drawing. The current and auxiliary sector is selected on the basis of analysis of a few criteria.

The first is if previous data writing was correctly completed. The second is if the sector contains data compliant with the required format. The third of the possibilities appears in case when emulation of the EEPROM memory is initiated for the first time.

The procedure starts operation in the point 901, where the first sector is set as the current one. Next, in the point 902 of the procedure it is checked if the saved data have a correct format and if they were correctly saved. It can be determined by analyzing appropriate bits of the patch header. If the check from step 903 determines that there are incorrect data in the first sector, the second sector is set as the current sector, and the first one as the auxiliary 909. If the check from the step 903 determines that there are correct data in the first sector, the second sector is set as the current one in the point 904. Next, in the point 905 of the procedure it is checked if the saved data have a correct format and if the data were correctly saved. If the check from the point 906 determines that there are incorrect data in the second sector, the first sector is set as the current sector, and the second one as the auxiliary 908. If the check from step 906 determines that there are correct data in the first sector, in the point 907 of the procedure the sector in which there is more free space is set as the current sector. The sector, in which there is more free space, contains more current data. The procedure of selecting the current and auxiliary sector ends in the point 910.

The invention claimed is:

1. A method of emulation of EEPROM memory in another non-volatile memory, the method comprising the steps:
   after initiating the emulation, reserving two sectors of the non-volatile memory, serving a function of a current sector and an auxiliary sector, creating a first buffer and a second buffer in an operational memory, the first buffer for storing a most current image of the emulated EEPROM memory, and the second buffer for storing a last patch, wherein the current sector of non-volatile memory has a part of the current sector containing an original image of the emulated EEPROM memory, and a remaining part is successively filled in with patches, the patches describing changes in content of the original image of the emulated EEPROM memory, and wherein at time, when a new patch cannot be appended to the current sector, the function of the current sector and the auxiliary sector of non-volatile memory are changed, the previously auxiliary sector of non-volatile memory is activated by saving the current image of the emulated EEPROM memory from the operational memory to a newly activated sector as a new original image of the emulated EEPROM memory, whereas, after a correct writing, content of the previously current sector of non-volatile memory is erased.

2. The method of emulation of the EEPROM memory according to claim 1, further comprising the step:
   creating a third buffer in the operational memory, which is used for storing a compressed version of the last patch.

3. The method of emulation of the EEPROM memory according to claim 2, wherein at initiating of the emulation the current sector is selected, content of the auxiliary sector is erased and the original image of the emulated EEPROM memory is fetched from the current sector of the non-volatile memory to the operational memory, next a first patch is fetched from the current sector of non-volatile memory and its validity is checked, while if the first patch was not invalidated it is checked if the first patch data are compressed and in case when they are uncompressed, they are saved in the buffer of operational memory, which stores the most current image of the emulated EEPROM memory, whereas when the first patch data are compressed, before saving to the memory buffer, the first patch data are decompressed, while in case, when the first patch data are invalidated it is skipped, while at an end of initiating emulation it is checked if there are still data for reading in the non-volatile memory and if there are data for reading, next patches are processed according to a described algorithm.

4. The method of emulation of the EEPROM memory according to claim 3, wherein the current sector and the auxiliary sector are selected by setting the first sector as the current sector, next it is checked if saved data have a correct format and if the saved data were correctly saved, and if it appears that there are incorrect data in the first sector, the second sector is set as the current sector, while the first sector is set as the auxiliary sector, whereas when are correct data in the first sector, the second sector is set as the current sector, and next it is checked if the saved data have a correct format and if the data were saved correctly, and if a result of check shows that there are incorrect data in the second sector, the first sector is set as the current sector, while the second sector is set as the auxiliary sector, whereas if a result of check shows that there are incorrect data in the second sector one of the first sector and the second sector, in which there is more free space, is set as the current sector.

5. The method of emulation of the EEPROM memory according to claim 2, a process of writing a new patch starts from preparing data for updating the content of the non-volatile memory, while the data are also saved in the buffer of the operational memory, and next it is checked if the size of the new patch is greater than the a set value and if it is greater, the new patch is compressed, then it is checked if the result of compression corresponds to the required assumptions of reducing the new patch size, whereas in case of compliance the compressed patch is further processed, and in the opposite case the uncompressed patch is processed, next, it is checked if in the current sector of non-volatile memory there is sufficient space for saving the new patch and in case of sufficient space present, the new patch is saved, and in case of a lack of sufficient free space the current sector is changed into the auxiliary sector whereas the auxiliary sector is changed to the current sector and the new original image of the emulated EEPROM memory is saved in the current sector of the non-volatile memory, while the content of the auxiliary sector in the Flash memory is erased.

6. The method of emulation of the EEPROM memory according to claim 5, wherein in the process of preparing the new patch of the content of the non-volatile memory a preparation of the new patch for saving in the memory is made, next the data are saved in the operational memory, which stores the most current image of the EEPROM memory, at the same time the prepared patch is stored in the buffer of the operational memory, and next it is checked whether the patch, which was last saved in the non-volatile memory is valid while, if the patch is invalidated the writing process the new patch is continued, while in case when the previously saved patch is valid, it is checked if the currently processed patch reverses the changes introduced by the saving of the previous patch, whereas, if the processed patch did not reverse these changes, the writing process of the new patch is continued, and, in the opposite case, when the patch reverses the changes introduced by the saving of the previous patch, the value of the bit, which invalidates previously saved patch, is changed and the saving of the new patch to the non-volatile memory is canceled.

7. The method of emulation of the EEPROM memory according to claim 2, wherein a format of the patch consists of four fields, the first of which is a patch header, the second field appearing in case of patches containing many groups of data is a field of a size of data group, the third one appearing only in case of uncompressed patches is an offset field of data in relation to an initial address, while the last field in the patch is a data field, while the patch contains many data groups, of which every group is saved under a different memory address, and values of the offset of patch data groups contain an offset in relation to the final address of the previous data group, of which only the first offset defines the absolute address, while the next values are relative addresses in relation to the previous data group.

8. The method of emulation of the EEPROM memory according to claim 7, wherein the compressed patch does not contain the offset field, whereas value of the offset is read only after decompression of the patch.

9. The method of emulation of the EEPROM memory according to claim 7, wherein the format of the header of the patch consist of a start bit, changed at the time when preparation of the patch for saving is started a bit of correct writing of the size and format, changed after the size value and format of data are correctly recorded, the bit of correct writing, changed after the whole patch is correctly recorded in the non-volatile memory, an invalidation bit, which is changed after the patch is invalidated and a field defining the format of the patch and the field, defining the total amount of data in the patch, not considering the size of the header.

10. The method of emulation of the EEPROM memory according to claim 9, wherein the format of the patch is defined as a single update, or as a multi data groups patch or as a compressed patch.

11. The method of emulation of the EEPROM memory according to claim 5, wherein for the format of the header of the patch, containing the staff bit, changed in the time of staffing preparation of the patch for recording, the bit of correct writing of the size and format, changed after the data size or format are correctly recorded, the bit of correct writing, changed after the whole patch is correctly saved in the non-volatile memory, the invalidation bit, changed after the patch is invalidated and the field, defining the format of the patch and the field, defining the quantity of data in the patch, not considering the size of the header, saving of the patch starts from a change of the value of the start bit, after which the size and the type of the patch is recorded and if an error occurs the procedure ends, while if the writing of the fields is correct, the value of the bit in the field of correct writing of the size and format is changed and separate data groups are further recorded, and if an error occurs the procedure ends, while, if the so-far-writing is correct the value of the bit of correct writing is changed and at this moment the procedure ends and the patch is correctly recorded in the non-volatile memory.

12. A method of software emulation of EEPROM memory in another non-volatile memory of a device with an operational memory, the method comprising the steps of:
creating in the operational memory a first buffer for storing a current image of an emulated EEPROM memory and a second buffer for storing a last patch;
applying two sectors of non-volatile memory as a current sector and an auxiliary sector;
storing an image of the emulated EEPROM memory in a part of the current sector;
filling in the remaining part of the current sector with one or more patches describing changes in content of the image of the emulated EEPROM memory and storing the current image of the emulated EEPROM memory in the first buffer and repeating the steps of filling in and storing the current image until a new patch cannot be added to the current sector;
changing a sector being previously the auxiliary sector into the current sector and a sector being previously the current sector into the auxiliary sector;
saving the current image of the emulated memory from the first buffer of the operational memory to the current sector being newly activated as the image of the emulated memory;
erasing content of the auxiliary sector being newly activated after a correct saving of the current image of the emulated memory; and
returning to a step of the filling in the remaining part of the current sector with one or more patches describing changes in the content of the image of the emulated EEPROM memory.

13. The method of emulation of the EEPROM memory according to claim 12, wherein the step of the applying the two sectors of non-volatile memory as the current sector and the auxiliary sector comprises the steps of:
selecting the current sector from the two sectors of the non-volatile memory, the current sector containing the image of the emulated EEPROM memory and the patches describing changes in the content of the image of the emulated EEPROM memory;
erasing content of the auxiliary sector;
fetching the image of the emulated EEPROM memory from the current sector of the non-volatile memory to the operational memory;
fetching a first patch of the patches from the current sector of non-volatile memory;
checking validity of the first patch;
saving data of the first patch in the first buffer of the operational memory when the data is not invalidated and uncompressed and saving the data after decompressing when the data is not invalidated and compressed and skipping the first patch when the first patch is invalidated;
checking if in the current sector of the non-volatile memory are another patches; and processing remained patches in the current sector of the non-volatile memory like the first patch.

14. The method of emulation of the EEPROM memory according to claim 13, wherein the step of the selecting the current sector from the two sectors of the non-volatile memory comprises the steps of:
setting initially a first sector of the two sectors of the non-volatile memory as the current sector;
checking if the data saved in the first sector haves have a correct format and were correctly saved;
setting initially a second sector of the two sectors of the non-volatile memory as the current sector when the data saved in the first sector have an incorrect format or were incorrectly saved;
checking if the data saved in the second sector have a correct format and were correctly saved;
setting the first sector of the two sectors of the non-volatile memory as the current sector and setting the second sector of the two sectors of the non-volatile memory as the auxiliary sector when the data saved in the second sector have an incorrect format or were incorrectly saved; and
setting one sector of the two sectors having more free space as the current sector when the data saved in the first sector and the second sector have an incorrect format or were incorrectly saved.

15. The method of emulation of the EEPROM memory according to claim 12, wherein a writing process of the new patch comprises the steps of:
preparing data for updating the content of the non-volatile memory and saving the data in the first buffer of the operational memory;
checking size of the data;
compressing the data when the size of the data is greater than a set value;

checking free space for saving the data in the current sector of the non-volatile memory;

saving the data as the new patch when the free space in the current sector of the non-volatile memory has a sufficient size for saving the new patch;

changing the auxiliary sector into the current sector and a sector being previously the current sector into the auxiliary sector when in the current sector of the non-volatile memory is no sufficient free space for saving the new patch and saving the new patch in a sector being previously the auxiliary sector and erasing a content of the sector being previously the current sector.

16. The method of emulation of the EEPROM memory according to claim 12, wherein a format of the patches consists of a first field being a patch header, a second field containing many groups of data and having a size of data groups, a third field containing an offset field of data in relation to an initial address and fourth field containing data, wherein each patch contains many data groups saved under different memory addresses and wherein values of offsets of the data groups contain an offset in relation to a last address of a previous data group, of which only the first offset defines an absolute address, whereas next values are relative addresses in relation to the previous data group.

17. The method of emulation of the EEPROM memory according to claim 16, wherein the format of the patch header consist of a start bit changed at time when preparation of the patch for saving is started, a bit of correct writing of size and format changed after a size value and format of data are correctly recorded, a bit of correct writing changed after the whole patch is correctly recorded in the non-volatile memory, an invalidation bit changed after the patch is invalidated and a field defining a format of the patch and the field defining total amount of data in the patch, not considering the size of the header.

18. A method of a software emulation of an EEPROM memory in another non-volatile memory of a device with an operational memory, the method comprising the steps of:

creating in the operational memory a first buffer for storing a current image of the emulated EEPROM memory;

setting two sectors of the non-volatile memory as a current sector and an auxiliary sector;

storing an image of the emulated EEPROM memory in a part of the current sector;

updating the emulated EEPROM memory by adding, to the remaining part of the current sector, one or more patches, describing changes in content of the current image of the emulated EEPROM memory, and storing the current image of the emulated EEPROM memory, including the changes made by the one or more patches, in the first buffer;

repeating the step of updating the emulated EEPROM memory until a new patch cannot be added to the current sector;

setting the auxiliary sector as the current sector and the current sector as the auxiliary sector;

storing the current image of the emulated memory from the first buffer of the operational memory to the current sector; and after the storing of the current image, from the first buffer, in the current sector has been finished successfully, erasing the auxiliary sector.

19. The method according to claim 18 further comprising the step of:

returning to the step of updating the emulated EEPROM memory after the step of erasing the auxiliary sector.

20. The method according to claim 18 wherein a second buffer is created, in the operational memory, for storing the last patch describing changes in content of the current image of the emulated EEPROM memory.

* * * * *